(12) United States Patent
Pandey et al.

(10) Patent No.: US 11,082,012 B2
(45) Date of Patent: Aug. 3, 2021

(54) HIGHLY LINEAR INPUT AND OUTPUT RAIL-TO-RAIL AMPLIFIER

(71) Applicant: Cirrus Logic International Semiconductor Ltd., Edinburgh (GB)

(72) Inventors: Vaibhav Pandey, Pflugerville, TX (US); Bhoodev Kumar, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 84 days.

(21) Appl. No.: 16/409,580

(22) Filed: May 10, 2019

(65) Prior Publication Data

US 2020/0358406 A1   Nov. 12, 2020

(51) Int. Cl.
*H03F 3/45*   (2006.01)
*H03F 1/32*   (2006.01)
(Continued)

(52) U.S. Cl.
CPC ......... *H03F 1/3211* (2013.01); *H03F 1/3205* (2013.01); *H03F 1/56* (2013.01);
(Continued)

(58) Field of Classification Search
CPC ........ H03F 1/3211; H03F 1/3205; H03F 1/56; H03F 3/45273; H03F 2203/45116;
(Continued)

(56) References Cited

U.S. PATENT DOCUMENTS

| 7,049,889 B2 * | 5/2006 | Kalb | ........................ H03F 1/301 330/253 |
| 7,339,430 B2 * | 3/2008 | Chiu | .................... H03F 3/45183 330/253 |

(Continued)

OTHER PUBLICATIONS

Carrillo, Juan M. "Constant-gm Constant-Slew-Rate High-Bandwidth Low-Voltage Rail-to-Rail CMOS Input Stage for VLSI Cell Libraries" IEEE Journal of Solid-State Circuits, vol. 38, No. 8, Aug. 2003. pp. 1364-1372.
Duque-Carrillo, J. Francisco, et al. "Constant-Gm Rail-to-Rail Common-Mode Range Input Stage with Minimum CMRR Degradation." IEEE Journal of Solid-State Circuits vol. 28, No. 6, Jun. 1993. pp. 661-666.

*Primary Examiner* — Khanh V Nguyen
(74) *Attorney, Agent, or Firm* — E. Alan Davis; James W. Huffman

(57) ABSTRACT

An amplifier includes input transconductors that receive an input signal, the input signal having a voltage swing. A supply side current mirror generates a gate voltage as a function of input signal voltage and current sources that provide a bias current of the input transconductors as a function of the gate voltage to maintain a constant bias current across the voltage swing of the input signal. Resistors average source voltages of the transconductance-cancelling transconductors to provide an average source voltage and apply the average source voltage to wells of input devices of the transconductance-cancelling transconductors to reduce back bias effect. The input devices are laid out in a same well and have a common centroid to cancel out process mismatches. A first I-DAC trims an offset of first transconductors, and a second I-DAC trims an offset of second transconductors to attain low offsets across a rail-to-rail input common mode range.

24 Claims, 7 Drawing Sheets

(51) Int. Cl.
*H03F 1/56* (2006.01)
*H03M 1/66* (2006.01)

(52) U.S. Cl.
CPC .......... *H03F 3/45273* (2013.01); *H03M 1/66* (2013.01); *H03F 2200/129* (2013.01); *H03F 2200/222* (2013.01); *H03F 2200/375* (2013.01); *H03F 2203/45116* (2013.01)

(58) Field of Classification Search
CPC ......... H03F 2200/375; H03F 2200/222; H03F 2200/129; H03F 3/45183; H03F 3/45179; H03F 3/45192; H03F 3/45071; H03F 3/45085; H03M 1/66
USPC .................................................. 330/252–261
See application file for complete search history.

(56) References Cited

U.S. PATENT DOCUMENTS

| | | | |
|---|---|---|---|
| 7,863,982 B2 * | 1/2011 | Chen | H03F 3/4521 330/261 |
| 8,130,034 B2 * | 3/2012 | Song | H03F 3/45192 330/253 |
| 8,188,792 B1 * | 5/2012 | Narayan | G05F 3/262 330/257 |
| 8,436,682 B1 * | 5/2013 | Parkhurst | H03F 3/45183 330/261 |
| 2016/0098048 A1 * | 4/2016 | Sharma | H03F 3/45183 327/513 |
| 2020/0136577 A1 * | 4/2020 | Ivanov | H03F 3/45771 |

\* cited by examiner

HIGHLY LINEAR INPUT AND OUTPUT RAIL-TO-RAIL AMPLIFIER

BACKGROUND

The paper of J. M. Carrillo, J. F. Duque-Carrillo, G. Torelli, and J. L. Ausin, "Constant-constant-slew-rate high-bandwidth low-voltage rail-to-rail CMOS input stage for VLSI cell libraries," IEEE J. Solid-State Circuits, vol. 38, no. 8, pp. 1364-1372, August 2003 (hereinafter "Carrillo Paper"), which is incorporated by reference herein in its entirety for all purposes, describes "a general purpose low-voltage rail-to-rail input stage" that "provides constant small-signal and large-signal behaviors over the entire input common-mode voltage range, while imposing no appreciable constraint for high-frequency operation." A shortcoming of the circuit described in the Carrillo Paper is that it may not provide the linearity performance needed in some applications.

SUMMARY

In one embodiment, the present disclosure provides a method for maintaining a constant bias current across a voltage swing of an input signal received by input transconductors of an amplifier. The method includes generating a supply side current mirror gate voltage as a function of input signal voltage and using the gate voltage for controlling bias current sources to the input transconductors, wherein a bias current of the input transconductors is maintained as constant.

In another embodiment, the present disclosure provides an apparatus comprising an amplifier that includes input transconductors that receive an input signal, the input signal having a voltage swing. The amplifier also includes a supply side current mirror that generates a gate voltage as a function of input signal voltage and current sources that provide a bias current of the input transconductors as a function of the gate voltage to maintain a constant bias current across the voltage swing of the input signal.

In another embodiment, the present disclosure provides a method for increasing linearity of an amplifier having transconductance-cancelling transconductors. The method includes averaging source voltages of the transconductance-cancelling transconductors to provide an average source voltage and applying the average source voltage to wells of input devices of the transconductance-cancelling transconductors to reduce back bias effect. The input devices are laid out in a same well and have a common centroid to cancel out process mismatches.

In another embodiment, the present disclosure provides an amplifier having transconductance-cancelling transconductors and resistors that average source voltages of the transconductance-cancelling transconductors to provide an average source voltage and that apply the average source voltage to wells of input devices of the transconductance-cancelling transconductors to reduce back bias effect. The input devices are laid out in a same well and have a common centroid to cancel out process mismatches.

In another embodiment, the present disclosure provides a method of trimming offsets of transconductors of an amplifier to increase its linearity across a rail-to-rail input common mode range, wherein the amplifier receives an input voltage and includes a first one or more transconductors that process the input voltage when the input voltage is high and a second one or more transconductors that process the input voltage when the input voltage is low. The method includes using a first current digital-to-analog converter (I-DAC) to trim an offset of the first one or more transconductors that process the high input voltage. The method also includes using a second I-DAC to trim an offset of the second one or more transconductors that process the low input voltage. Using the first and second I-DACs attains low offsets across the rail-to-rail input common mode range.

In another embodiment, the present disclosure provides an amplifier that includes a first one or more transconductors that process an input voltage when the input voltage is high, a second one or more transconductors that process the input voltage when the input voltage is low, a first current digital-to-analog converter (I-DAC) used to trim an offset of the first one or more transconductors, and a second I-DAC used to trim an offset of the second one or more transconductors. Use of the first and second I-DACs attains low offsets across a rail-to-rail input common mode range over which the amplifier operates.

DETAILED DESCRIPTION

Figure 1:
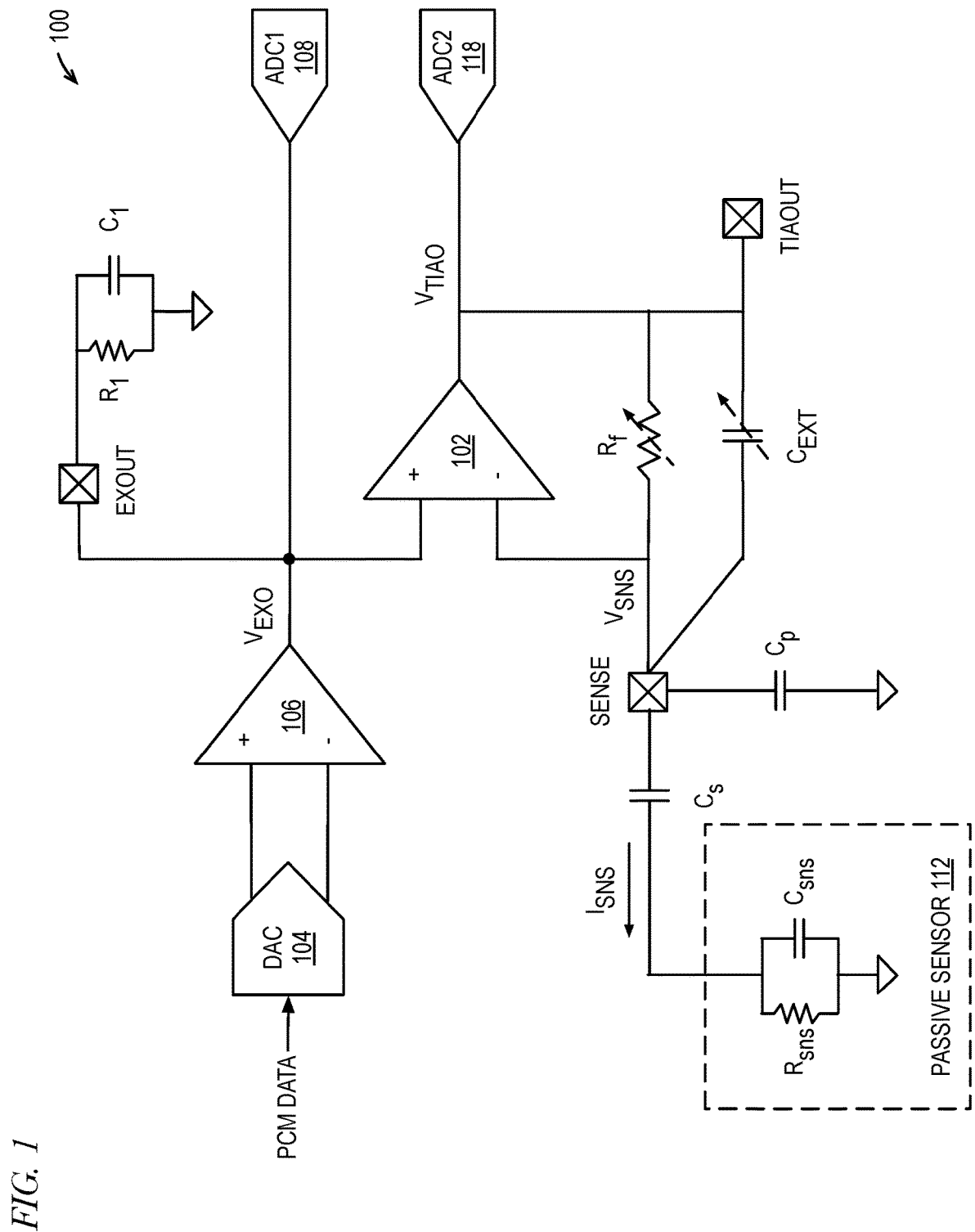
FIG. 1 is a diagram illustrating a subsystem that employs an amplifier that exhibits highly linear input and output rail-to-rail characteristics in accordance with embodiments of the present disclosure.

Referring now to FIG. 1, a diagram illustrating a subsystem 100 that employs an amplifier 102 that exhibits highly linear input and output rail-to-rail characteristics in accordance with embodiments of the present disclosure is shown. An application processor (not shown) drives pulse-code modulation (PCM) data to a digital-to-analog converter (DAC) 104. The DAC 104 converts the PCM data into an analog differential voltage which an amplifier 106 converts to an analog single-ended excitation out voltage $V_{EXO}$. The excitation out voltage $V_{EXO}$ is provided to a first analog-to-digital converter (ADC1) 108 and to a pin EXOUT, which is also coupled to an external load which may be modelled by a parallel combination of a resistor $R_1$ and capacitor $C_1$. The excitation out voltage $V_{EXO}$ value may be read from ADC1 108 and processed as desired. The excitation out voltage $V_{EXO}$ is coupled to a non-inverting input of the amplifier 102, which amplifies the excitation out voltage $V_{EXO}$. The excitation out voltage $V_{EXO}$ is amplified by the amplifier 102 and copied to a node $V_{SNS}$ that is coupled to an inverting input of the amplifier 102 and a pin SENSE. A capacitor $C_p$ is coupled between pin SENSE and ground.

The excitation out voltage $V_{EXO}$ excites a passive sensor 112 that produces a current $I_{SNS}$. The current $I_{SNS}$ may be sensed through pin SENSE at node $V_{SNS}$ and processed as desired. A resistor network is coupled between node $V_{SNS}$ and a node $V_{TIAO}$. Node $V_{TIAO}$ is coupled to the output of the amplifier 102 and a pin TIAOUT. Node $V_{TIAO}$ is sensed by a second ADC 118. The excitation out voltage $V_{EXO}$ is amplified onto node $V_{TIAO}$. The flow of current generated by the amplifier 102 through the feedback resistor network produces the voltage at node $V_{TIAO}$.

Advantageously, as described in more detail below, the amplifier 102 is a highly linear input and output rail-to-rail amplifier. More specifically, the amplifier 102 includes improvements over conventional amplifiers (e.g., over the amplifier of Carrillo) to improve its linearity and thereby reduce its total harmonic distortion (THD). In one embodiment, the amplifier 102 input ranges from zero to 3 volts, and the open-loop gain of the amplifier 102 is approximately 80 dB. In the example embodiment of FIG. 1, the resistor network comprises a variable resistor $R_f$ in parallel with a variable capacitor $C_{EXT}$. In one embodiment, the passive sensor 112 comprises a resistor $R_{SNS}$ in parallel with a capacitor $C_{SNS}$ coupled between ground and node $V_{SNS}$. The embodiment of FIG. 1 also includes a capacitor $C_S$ coupled between the passive sensor 112 and node $V_{SNS}$. In one embodiment, the passive sensor 112 is off-chip relative to the rest of the subsystem 100.

In the embodiment of FIG. 1, the combination of the sensor 112 and the amplifier 102 operates as a transimpedance amplifier (TIA) such that the output voltage $V_{TIAO}$ is highly linearly proportional to current $I_{SNS}$, and the feedback resistor $R_f$ operates as a transimpedance gain element to determine the ratio of the output voltage $V_{TIAO}$ to the current $I_{SNS}$, i.e., the transimpedance gain of the TIA. In one embodiment, the amplifier 102 is calibrated using on-chip ADC1 108 and ADC2 118 to determine the value of the transimpedance gain element $R_f$, as described in more detail below, such that the transimpedance gain is accurate to within 1%.

Figure 2:
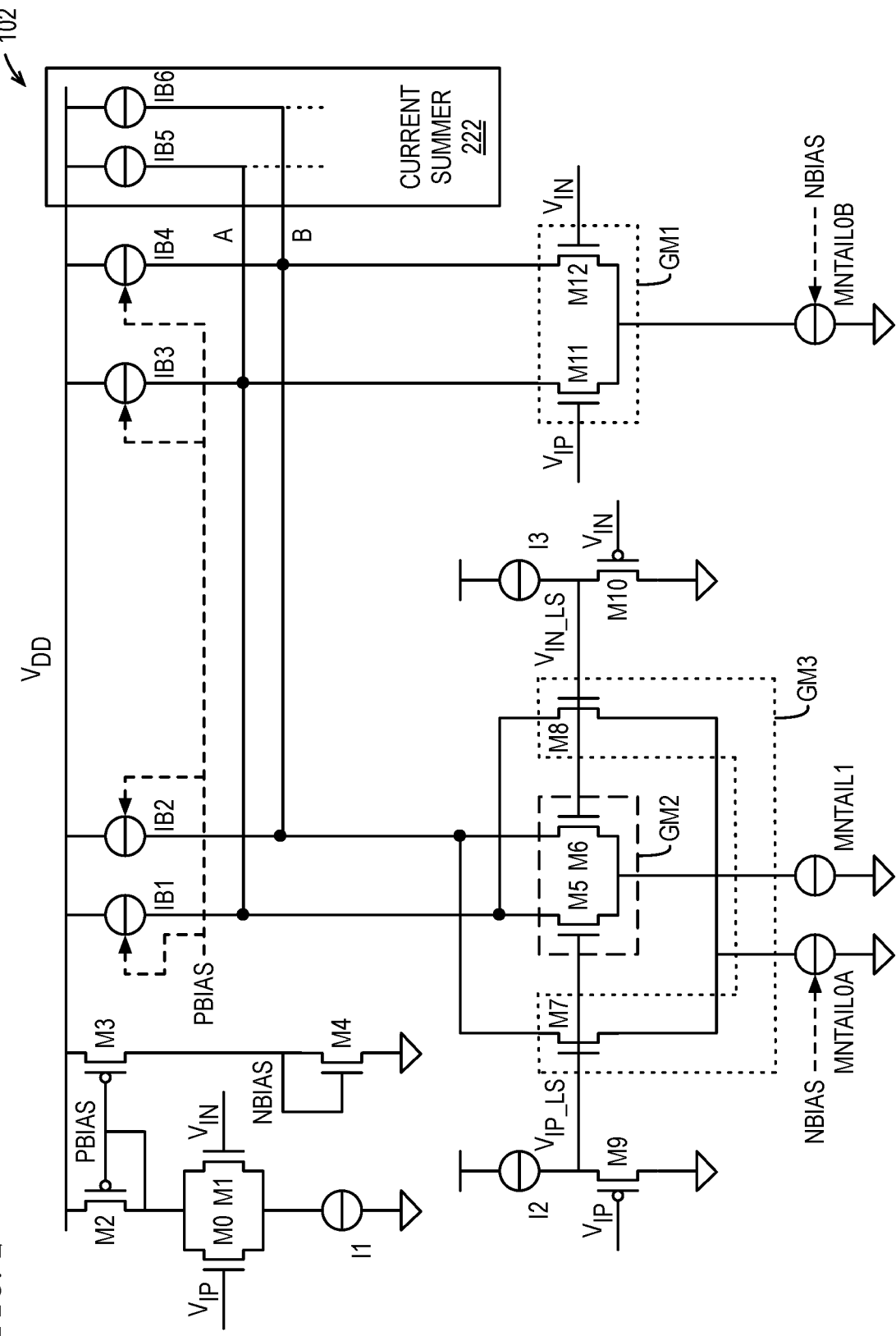
FIG. 2 is a circuit diagram illustrating portions of a highly linear input and output rail-to-rail amplifier in accordance with embodiments of the present disclosure.

Referring now to FIG. 2, a circuit diagram illustrating portions of a highly linear input and output rail-to-rail amplifier 102 (e.g., amplifier 102 of FIG. 1) in accordance with embodiments of the present disclosure is shown. The amplifier 102 builds upon the foundation of the input stage described in the Carrillo paper, but includes improvements that may increase its linearity performance, thereby reducing its THD. The amplifier 102 includes a current summer 222, or output stage, comprising constant current sources IB5 and IB6 that receive a supply voltage $V_{DD}$ and provide bias currents on respective nodes A and B to input transconductor GM1. In one embodiment, the current summer 222 is a folded cascode load to which current sources IB5 and IB6 also provide bias currents.

Transconductor GM1 comprises a pair of n-channel MOSFETs M11 and M12 whose source terminals share a common node along with a ground side current source MNTAIL0B that is controlled by a voltage at a node NBIAS, which is described in more detail below. In one embodiment, the current source MNTAIL0B comprises an n-channel MOSFET whose gate is coupled to the node that holds voltage NBIAS. The gate of transistor M11 receives an input signal voltage $V_{IP}$, and the gate of transistor M12 receives an input signal voltage $V_{IN}$. In one embodiment, the input signal voltages $V_{IP}$ and $V_{IN}$ comprise the respective positive and negative portions of a differential input signal voltage.

In one embodiment, the input signal voltages $V_{IP}$ and $V_{IN}$ are coupled to the inputs of a unity gain source follower amplifier comprising transistors M9 and M10. The drain of transistor M11 is coupled to node A, and the drain of transistor M12 is coupled to node B. The nodes A and B are referred to collectively as the summing node. As described in more detail below, the embodiment of FIG. 2 advantageously maintains an effectively constant DC bias current at the summing node even in the presence of large swings of the input signal voltage to improve the linearity of the amplifier 102 and reduce its THD over conventional amplifiers.

The amplifier 102 also includes a p-channel MOSFET M9 whose gate receives positive input signal voltage $V_{IP}$, whose drain is coupled to ground, and whose source is coupled to a constant supply side current source 12. Transistor M9 generates on its source a voltage $V_{IP\_LS}$ that is a level-shifted version of the positive input signal voltage $V_{IP}$. The amplifier 102 also includes a p-channel MOSFET M10 whose gate receives negative input signal voltage $V_{IN}$, whose drain is coupled to ground, and whose source is coupled to a constant supply side current source 13. Transistor M10 generates on its source a voltage $V_{IN\_LS}$ that is a level-shifted version of the negative input signal voltage $V_{IN}$.

Transconductor GM2 comprises a pair of n-channel MOSFETs M5 and M6 whose source terminals share a common node along with a constant ground side current source MNTAIL1. The gate of transistor M5 receives the positive level-shifted input signal voltage $V_{IP\_LS}$, and the gate of transistor M6 receives the negative level-shifted input signal voltage $V_{IN\_LS}$. The drain of transistor M5 is coupled to node A, and the drain of transistor M6 is coupled to node B.

Transconductor GM3 comprises a pair of n-channel MOSFETs M7 and M8 whose source terminals share a common node along with a ground side current source MNTAIL0A that is controlled by voltage NBIAS. The gate of transistor M7 receives the positive level-shifted input signal voltage $V_{IP\_LS}$, and the gate of transistor M8 receives the negative level-shifted input signal voltage $V_{IN\_LS}$. The drain of transistor M7 is coupled to node B, and the drain of transistor M8 is coupled to node A.

The amplifier 102 also includes a pair of p-channel MOSFETs M2 and M3 whose gates are coupled together at a node PBIAS. The sources of transistors M2 and M3 are coupled to the supply voltage $V_{DD}$. An n-channel MOSFET M4 has its source coupled to ground and its drain coupled to the drain of transistor M3 at node NBIAS to which the gate of transistor M4 is also coupled. As described above, voltage NBIAS controls the current sources MNTAIL0A and MNTAIL0B.

The amplifier 102 also includes a pair of n-channel MOSFETs M0 and M1 whose drains are coupled together and are coupled to the drain of transistor M2 at node PBIAS. The sources of transistors M0 and M1 are coupled together and are coupled to a constant ground-side current source I1. The gate of transistor M0 receives positive input signal voltage $V_{IP}$ and the gate of transistor M1 receives negative input signal voltage $V_{IN}$. Transistors M2 and M3 operate as a supply side current mirror that generates a gate voltage at node PBIAS as a function of the input signal voltage $V_{IP}$ and $V_{IN}$. The gate voltage PBIAS is used to control supply side current sources IB1, IB2, IB3 and IB4. Current sources IB1 and IB2 provide bias currents of transconductor GM2, and current sources IB3 and IB4 provide bias currents of transconductor GM3. Under the control of voltage PBIAS, current sources IB1-IB4 operate to maintain a constant DC bias current at the summing node across voltage swings of the input signal voltage $V_{IP}$ and $V_{IN}$, which advantageously improves the linearity of amplifier 102 and reduces THD. More specifically, current source IB1 is coupled between supply voltage $V_{DD}$ and node A to provide a bias current to the drain of transistor M5 to maintain a constant bias current across voltage swings of the input signal voltage $V_{IP}$ and $V_{IN}$; current source IB2 is coupled between supply voltage $V_{DD}$ and node B to provide a bias current to the drain of transistor M6 to maintain a constant bias current across voltage swings of the input signal voltage $V_{IP}$ and $V_{IN}$; current source IB3 is coupled between supply voltage $V_{DD}$ and node A to provide a bias current to the drain of transistor M11 to maintain a constant bias current across voltage swings of the input signal voltage $V_{IP}$ and $V_{IN}$; and current source IB4 is coupled between supply voltage $V_{DD}$ and node B to provide a bias current to the drain of transistor M12 to maintain a constant bias current across voltage swings of the input signal voltage $V_{IP}$ and $V_{IN}$. Preferably, current sources IB1, IB2, IB3 and IB4 comprise transistors of the same size and, being connected to the same supply voltage $V_{DD}$, provide the same current to transistors M5, M6, M11 and M12, respectively. In one embodiment, current sources IB1-IB4 each comprises a p-channel MOSFET whose gate is coupled to node PBIAS. The voltage at PBIAS is used to control the current sources IB1-IB4 as described in more detail below.

Generally, the amplifier 102 operates as follows. When the input signal voltage (i.e., $V_{IP}$ and $V_{IN}$) is low (e.g., below 0.8 Volts), transconductors GM1 and GM3 are inactive, and transconductor GM2 is active and provides the output signal current on nodes A and B. Transconductors GM1 and GM3 are inactive because the NBIAS voltage controls current sources MNTAIL0A and MNTAIL0B to withhold tail currents from transconductors GM1 and GM3. Control voltage NBIAS operates to turn off current sources MNTAIL0B and MNTAIL0A as follows. When the input signal voltage is low (e.g., below 0.8 Volts), transistors M0 and M1 turn off, shutting down the current mirror formed by transistors M2 and M3, which turns off the current flowing into transistor M4, and voltage NBIAS is close to zero Volts. When the input signal voltage is high (e.g., above 2.2 Volts), transconductors GM2 and GM3 are inactive, and transconductor GM1 is active and provides the output signal current on nodes A and B. Transconductors GM2 and GM3 are turned off because the sources of transistors M9 and M10—which level shift $V_{IP}$ and $V_{IN}$, respectively—get too high such that current sources 12 and 13 shut off. Thus, no signal content is present on the inputs of transconductors GM2 and GM3, which causes transconductors GM2 and GM3 not to generate any signal current. When the input signal voltage is in the middle of the input voltage range (e.g., between 0.8 and 2.2 Volts), all three transconductors are active; however, transconductors G2 and G3 effectively cancel each other out (because their outputs are reverse-coupled to nodes A and B, and as further explained below with respect to FIG. 3) such that transconductor GM1 provides the output signal current on nodes A and B. Thus, the three transconductors operate together to generally provide highly linear input and output rail-to-rail characteristics because for any given input voltage, only one transconductor generates a signal current.

Generally, the supply side bias current to the input transconductors GM2 and GM3 is switched with the input signal level. When the input signal level is low (e.g., below 0.8 Volts), transistors M0 and M1 turn off, shutting down the current mirror formed by transistors M2 and M3, and voltage PBIAS is close to supply voltage $V_{DD}$ and voltage NBIAS is close to zero Volts, which turns off current sources IB1, IB2, IB3, IB4, MNTAIL0A and MNTAIL0B. During this condition, the current flowing into nodes A and B is set by current sources IB5 and IB6, and the current flowing into nodes A and B is equal to the current flowing into the current source MNTAIL1. When the input signal voltage is not low (e.g., above 0.8 Volts), transistors M0 and M1 turn on, turning on the current mirror formed by transistors M2 and M3, and voltage PBIAS is set to a desired operating voltage, which turns on current sources IB1, IB2, IB3, IB4, MNTAIL0A and MNTAIL0B. During this operating condition, the current IB1 and IB2 equals the current flowing into current source MNTAIL0A, and the current IB3 and IB4 equals the current flowing into current source MNTAIL0B. At the same time, the current flowing into MNTAIL1 is set by IB5 and IB6. Thus, at all input voltage levels, the current flowing into the summing node A and B is maintained constant, reducing the voltage swing on the summing node A and B. In this manner the voltage non-linearity introduced from the summing node A and B is reduced. As a result, the bias current in the output stage does not change with a swing in the input signal, and the amplifier 102 enjoys improved linearity, or lower THD, over conventional amplifiers that do not maintain a constant bias current. In one embodiment, the amplifier 102 is capable of inputting a zero to 3 Volt peak-to-peak single ended input signal while maintaining linearity of greater than 80 dB across the input signal swing.

Figure 3:
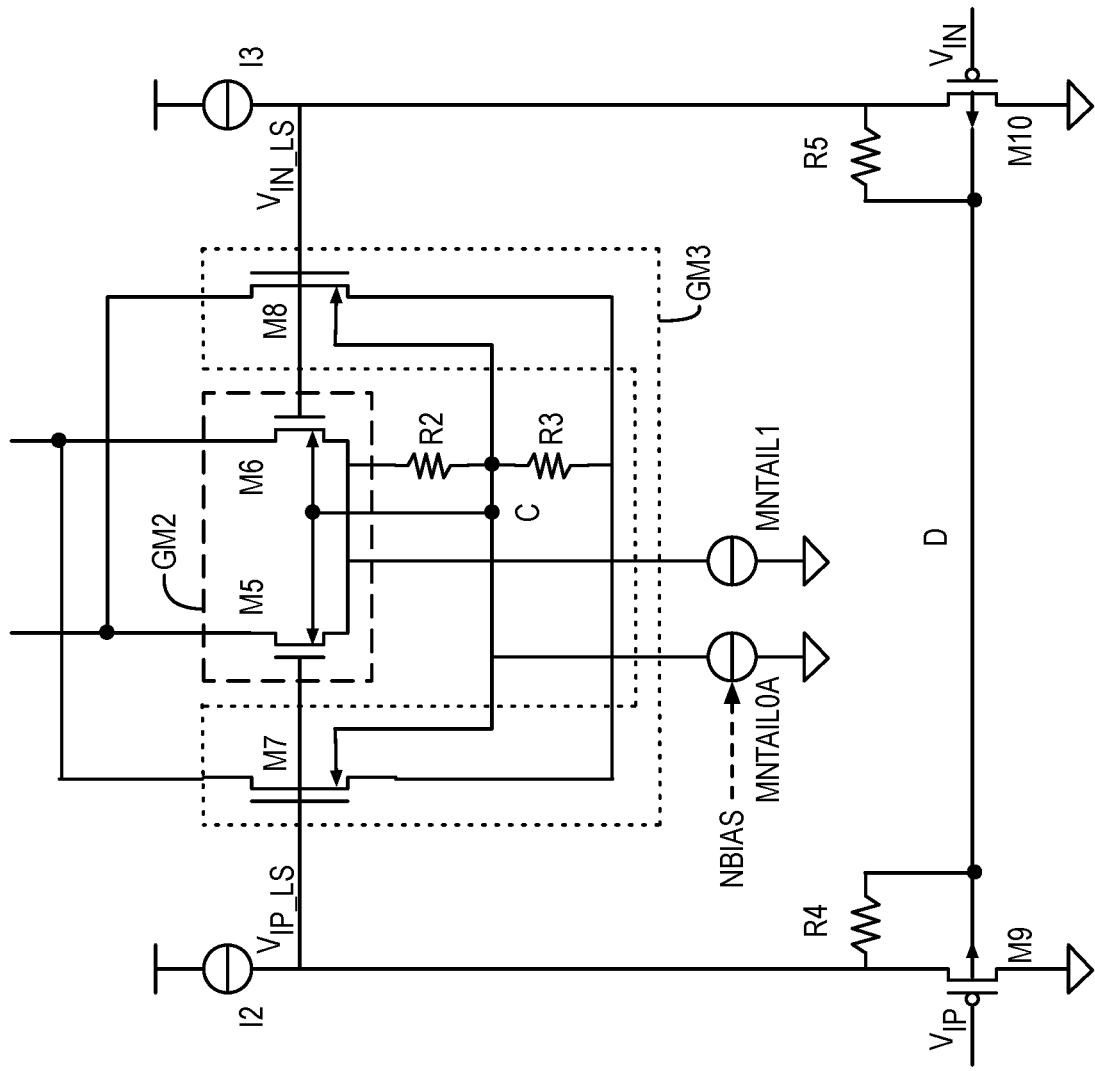
FIG. 3 is a circuit diagram illustrating portions of a highly linear input and output rail-to-rail amplifier in accordance with embodiments of the present disclosure.
Figure 4:
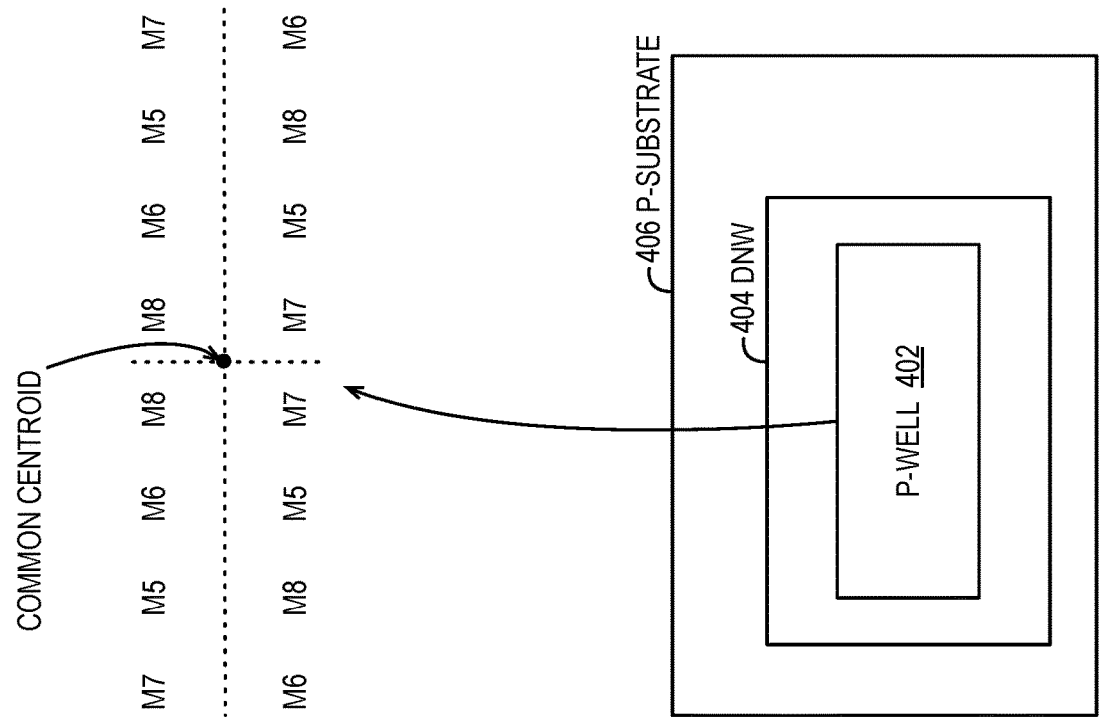
FIG. 4 is a diagram illustrating a same well in which transconductor input devices are laid out and have a common centroid in accordance with embodiments of the present disclosure.

Referring now to FIG. 3, a circuit diagram illustrating portions of a highly linear input and output rail-to-rail amplifier 102 (e.g., amplifier 102 of FIG. 2) in accordance with embodiments of the present disclosure is shown. FIG. 3 shows transconductors GM2 and GM3, current sources I2 and I3, transistors M9 and M10, and current sources MNTAIL0A and MNTAIL1, e.g., of FIG. 2. Transconductors GM2 and GM3 operate as a transconductance-cancelling transconductor pair. In the embodiment of FIG. 3, the input devices M5 and M6 of transconductor GM2 and the input devices M7 and M8 of transconductor GM3 are n-channel MOSFETs; however, other embodiments are contemplated in which the input devices are of other types. A transconductance-cancelling transconductor pair is formed when two transconductors that generate equal-and-opposite current are coupled together at their outputs such that the signal current generated by one transconductor is cancelled by the other transconductor and effectively no current flows to the output. The source of transconductor GM2, i.e., the sources of input devices M5 and M6, are coupled to a node C through a resistor R2, and the source of transconductor GM3, i.e., the sources of input devices M7 and M8, are coupled to node C through a resistor R3 of equal value to resistor R2, such that the voltage at node C is an average of the source voltages of the transconductors GM2 and GM3. Node C is coupled to the wells of input devices M5 through M8 such that the voltage at node C is applied to the wells, which tends to advantageously eliminate back bias effect, which increases the linearity of the amplifier 102 and reduces THD. Furthermore, the input devices M5 through M8 are laid out in the same well (e.g., P-well 402 of FIG. 4, surrounded by a deep N-well (DNW) 404 on a P-substrate 406) and have a common centroid (as shown in FIG. 4), which tends to advantageously cancel out process mismatches, which increases the linearity of the amplifier 102 and reduces THD. A MOS transistor manufactured in a CMOS process has 4 terminals: Gate, Drain, Source and Bulk. The gate and bulk terminals have associated gate transconductance and body transconductance, respectively. It is imperative to have the bulk and source voltages track each other such that the current generated by the bulk/body transconductance is zero. Otherwise, the transconductance associated with the body terminal will inject a current proportional to the voltage between the bulk and source terminals. The injected current is signal dependent, and as such is non-linear. Since in normal operation, the amplifier 102 forces $V_{IP}$ and $V_{IN}$ to be equal, the source terminals of the transistors M5 through M8 see a level-shifted voltage from $V_{IP}/V_{IN}$. Since the voltages at $V_{IP}$ and $V_{IN}$ can swing between 0 and 3 Volts, the source terminal of transistors M5 through M8 see a large voltage excursion. By connecting the resistors in the above fashion, a common node is generated that tracks the average voltage on $V_{IP}$ and $V_{IN}$. By connecting node C to the well/body/bulk of the transistors, the body transconductance is nullified. Also, by connecting all the bulk terminals to a common net, transistors M5 through M8 are able to be clubbed in the same well, which enables common centroiding of transistors M5 through M8. As a result, any process variation is advantageously cancelled, and the transconductance of GM2 and GM3 are very similar and cancel out by virtue of the drain connection.

Additionally, the source of input device M9 is coupled to a node D through a resistor R4, and the source of input device M10 is coupled to node D through a resistor R5 of equal value to R4, such that a second voltage at node D is an average of the source voltages of input devices M9 and M10. Node D is coupled to the wells of input devices M9 and M10 such that the voltage at node D is applied to the wells, which tends to advantageously eliminate back bias effect. Furthermore, the input devices M9 and M10 are laid out in the same well and have a common centroid, which tends to advantageously cancel out process mismatches.

Figure 5:
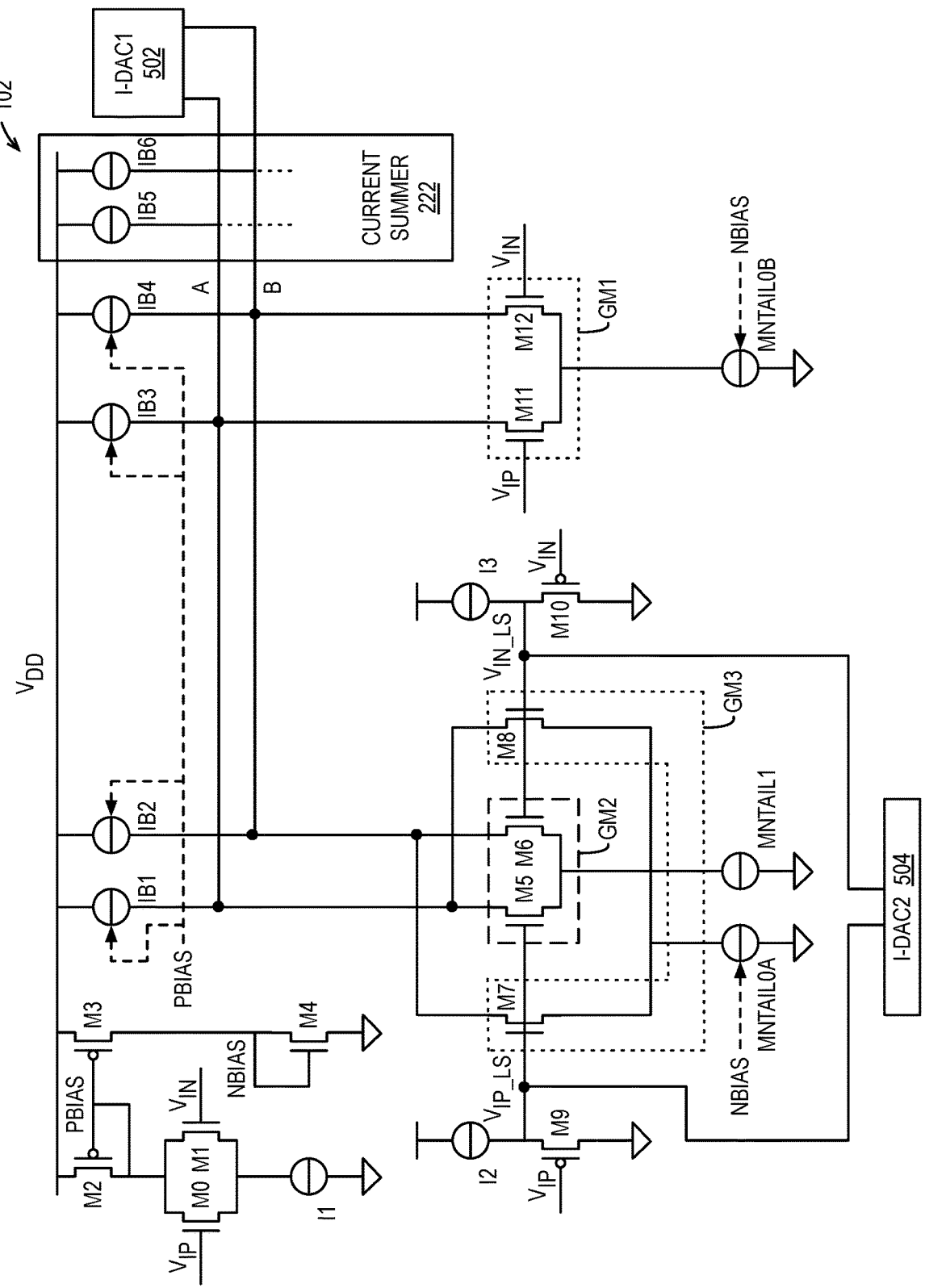
FIG. 5 is a circuit diagram illustrating portions of a highly linear input and output rail-to-rail amplifier in accordance with embodiments of the present disclosure.

Referring now to FIG. 5, a circuit diagram illustrating portions of a highly linear input and output rail-to-rail amplifier 102 (e.g., amplifier 102 of FIG. 2) in accordance with embodiments of the present disclosure is shown. More specifically, FIG. 5 illustrates a system and method of trimming offsets for transconductors GM1 through GM3 within the amplifier 102 to improve its linearity across the complete rail-to-rail input common mode voltage range. The portions of the amplifier 102 shown in FIG. 5 are similar to those shown in FIG. 2. However, the embodiment of FIG. 5 also includes a first current digital-to-analog converter (I-DAC) 502 whose output is coupled to the summing node (i.e., nodes A and B of FIG. 1) and a second I-DAC 504 whose output is coupled to the respective drains of PMOS transistors M9 and M10 that generate the respective level-shifted input voltage $V_{IP\_LS}$ and $V_{IN\_LS}$.

As described above, depending upon the input signal level, amplifier 102 uses different combinations of the transconductors GM1, GM2 and GM3 to process the input voltage to generate the output current to operate in a highly linear fashion across the rail-to-rail input common mode range. In one embodiment, the rail-to-rail input common mode range is from a lower rail of zero Volts to an upper rail of 3 Volts. In particular, the amplifier 102 may operate in three different modes: when the input voltage is near the lower rail, GM2 provides the output current; when the input voltage is near the upper rail, GM1 provides the output current; and when the input voltage is in the middle, all three transconductors provide an output current, but GM2 and GM3 cancel each other such that GM1 effectively provides the output current.

During fabrication of the amplifier 102, a process gradient may create an offset, or current mismatch, within a transconductor. For example, if the threshold voltages of NMOS transistors M11 and M12 are slightly different, then transconductor GM1 may generate a current with an offset. A similar current offset may be generated by transconductor GM2 if the threshold voltages of NMOS transistors M5 and M6 are slightly different, and current offset may be generated by transconductor GM3 if the threshold voltages of NMOS transistors M7 and M8 are slightly different. Additionally, if the threshold voltages of PMOS transistors M9 and M10 are slightly different, then a voltage offset may appear on the level-shifted input voltage $V_{IP\_LS}$ and $V_{IN\_LS}$ which may cause an offset on the current output by transconductors GM2 and GM3. The offsets may be measured during fabrication of the amplifier 102 and stored so that they may be trimmed during operation of the amplifier 102 using I-DAC1 502 and I-DAC2 504.

During operation, a control circuit (not shown) provides a digital value to I-DAC1 502 that represents a current value and, in response, I-DAC1 502 generates an analog current on the summing node that corresponds to the digital value when indicated to do so by the control circuit. The current generated by I-DAC1 502 is equal in magnitude and opposite in sign of the offset measured during fabrication in order to nullify the measured offset, i.e., to trim the offset. Similarly, the control circuit provides a digital value to I-DAC2 504 that represents a current value and I-DAC2 504 responsively generates a corresponding analog current that is equal in magnitude and opposite in sign of the offset measured during fabrication in order to trim the offset. Advantageously, the control circuit causes I-DAC1 502 and I-DAC2 504 to trim the respective offsets at appropriate times depending upon the mode in which the amplifier 102 is operating. More specifically, I-DAC1 502 trims the offsets associated with transconductors GM1, GM2 and GM3 formed by NMOS devices M5, M6, M7, M8, M11 and M12 that are active during some of the operating modes (e.g., when the input voltage is close to the mid-range or above, e.g., above 0.8 Volts), whereas I-DAC2 504 trims offsets associated with the PMOS devices M9 and M10 and transconductors GM2 and GM3 that are active during other operating modes (e.g., when the input voltage is close to ground, e.g., below mid-range). In this manner, the offsets are trimmed across the rail-to-rail common mode input voltage range during operation of the amplifier 102 thereby advantageously increasing the linearity of the amplifier 102 and reducing THD. More specifically, without the benefit of both the I-DACs to trim the offsets over the entire rail-to-rail common mode input voltage range, a significant non-linearity might be observed. For example, assume only I-DAC1 502 is present and I-DAC2 504 is absent. In such case, I-DAC1 502 would compensate for offsets associated with operation in the high input voltage range; however, when the input voltage approaches ground (e.g., below 0.8 Volts), an offset in the output current may be observed since there would be no compensation for the offsets associated with the PMOS devices, which might cause a second-order non-linearity. That is, each time the input voltage crossed a certain level, a step may occur in the output current, which may manifest as undesirable tones.

Figure 6:
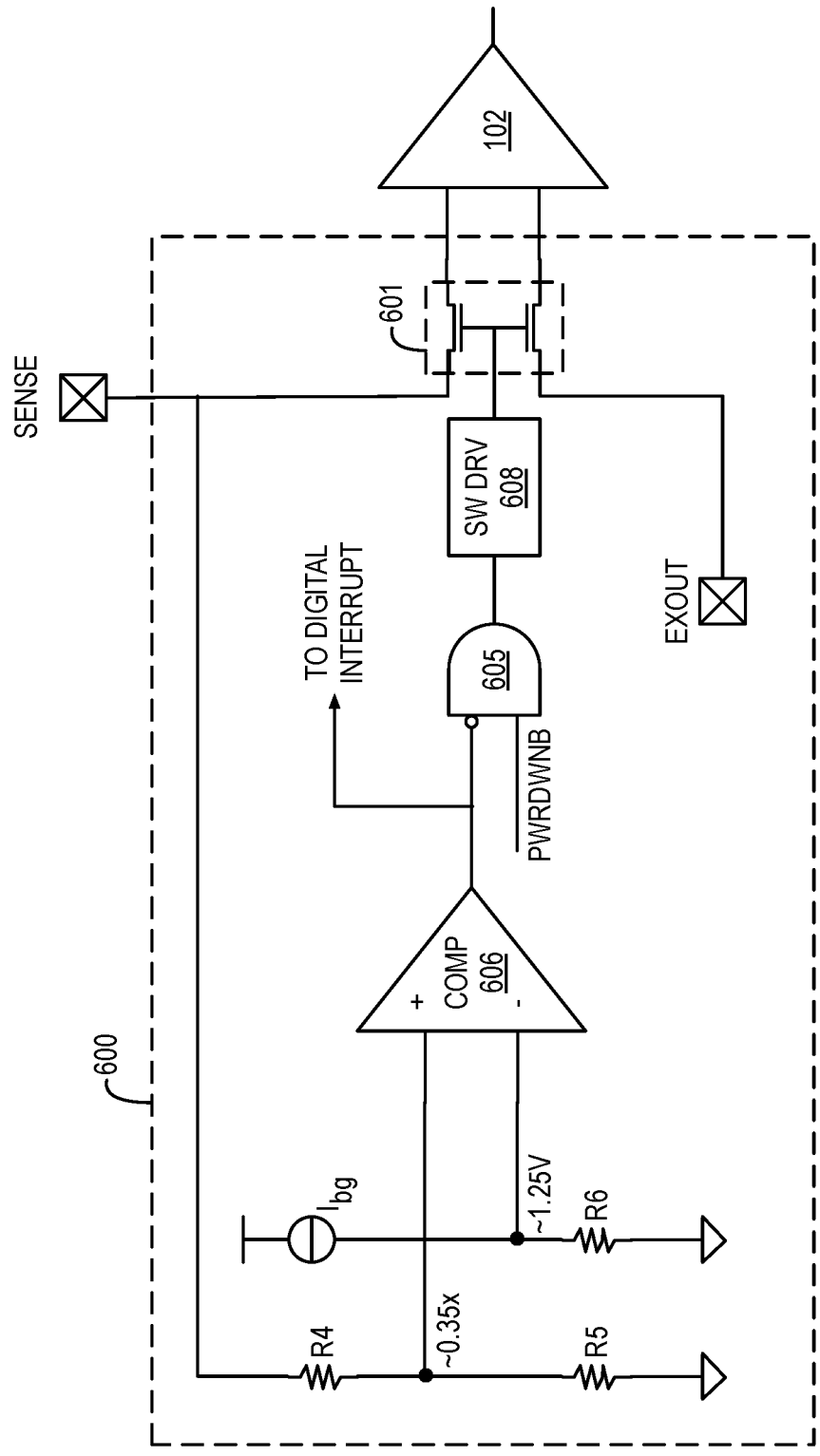
FIG. 6 is a diagram illustrating an input protection circuit to protect an amplifier in accordance with embodiments of the present disclosure.

Referring now to FIG. 6, a diagram illustrating an input protection circuit 600 to protect an amplifier in accordance with embodiments of the present disclosure is shown. The protected amplifier may be an amplifier such as amplifier 102 employed of subsystem 100 of FIG. 1. The protection circuit 600 includes a pair of switches 601. One side of each of the switches 601 is coupled to the gates of the input devices of the amplifier 102, e.g., the gates of transistors M0, M1, M9, M10, M11 and M12 of FIG. 2. The other side of the switches 601 is connected to the input; more specifically, one of the switches 601 is connected to the external sensor via pin SENSE, and the other of the switches 601 is connected to the external load via pin EXOUT. The gate of the switches 601 is coupled to a switch driver 608 that is controlled by the output of an AND gate 605. One input of the AND gate 605 receives a PWRDWNB signal which is normally true and becomes false when a power down of the system 100 should be performed. The other input to the AND gate 605 is a negated version of an output of a comparator 606. The comparator 606 receives on one input a reference voltage (e.g., approximately 1.25 Volts) generated by a resistor R6 coupled between ground and a current source $I_{bg}$. The comparator 606 receives on its other input a stepped-down version of the voltage $V_{SNS}$ at the SENSE pin of FIG. 1. A resistor R5 coupled to ground and a resistor R4 coupled in series between resistor R5 and the SENSE pin accomplish the voltage step down (e.g., approximately 0.35 the voltage at the SENSE pin). As described above with respect to FIG. 1, the SENSE pin may be used to sense the current $I_{SNS}$ produced by the passive sensor 112 in response to the excitation out voltage $V_{EXO}$.

Normally, the comparator 606 output is false, and since the PWRDWNB signal is normally true, the output of the AND gate 605 is normally true, which causes the switches 601 to be closed. However, when a faulty short condition occurs at the SENSE pin such that the voltage on the SENSE pin rises above a threshold (e.g., 3.6 Volts), the comparator 606 generates a true signal on its output, which causes the AND gate 605 to generate a false output, which causes the switches 601 to open, thereby disconnecting the shorting SENSE pin from the amplifier 102 and protecting the input devices of the amplifier 102. Additionally, the output of the comparator 606 is provided as an interrupt to a digital circuit (e.g., a control processor).

Figure 7:
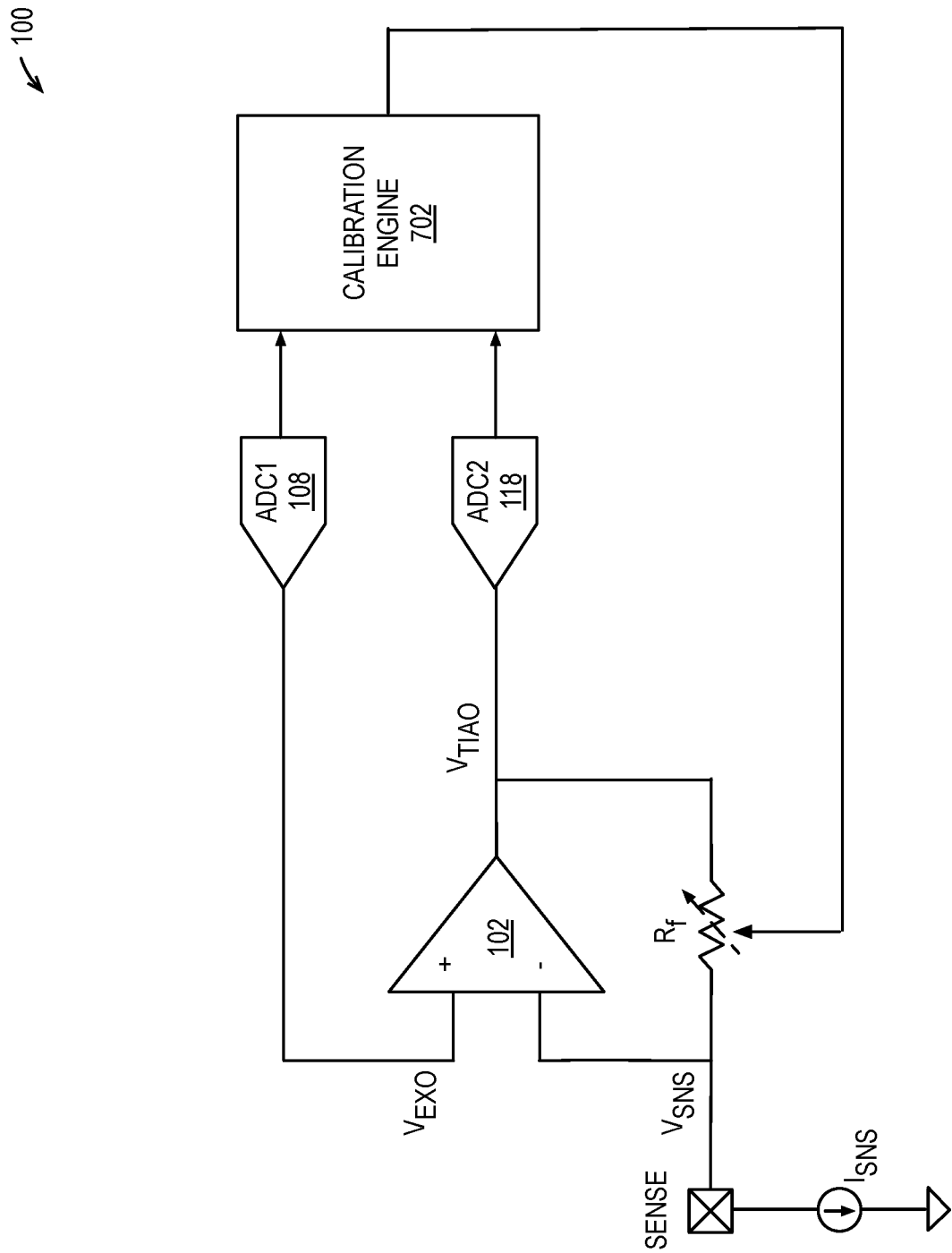
FIG. 7 is a diagram illustrating digital calibration of a transimpedance gain element in accordance with embodiments of the present disclosure.

Referring now to FIG. 7, a diagram illustrating digital calibration of a transimpedance gain element in accordance with embodiments of the present disclosure is shown. Portions of the system 100 of FIG. 1 are shown, namely the amplifier 102, ADC1 108, ADC2 118, an external current source $I_{SNS}$, SENSE pin, and transimpedance gain element $R_f$. Additionally, a calibration engine 702 receives the outputs of ADC1 108 and ADC2 118. The calibration engine 702 calibrates the transimpedance gain element $R_f$ using the ADCs 108/118 as follows.

The output voltage $V_{TIAO}$ is computable as the product of the sensed current $I_{SNS}$ and the transimpedance gain element $R_f$ as shown in equation (1).

$$V_{TIAO} = I_{sns} R_f \quad (1)$$

The calibration engine 702 may perform a digital calibration loop according to one embodiment as described with respect to equations (2) through (5) below. Let $N_{R_f}$ signify a digital representation of transimpedance gain element $R_f$. Let $N_{TIAO}$ represent the output of ADC2 118. Let $N_{EXO}$ represent the output of ADC1 108. Let k represent a digital representation of current $I_{sns}$ that produces the output $N_{TIAO}$, which is computable as shown in equation (2).

$$k = \frac{N_{TIAO}}{N_{R_f}} \quad (2)$$

During manufacturing of the system 100, a current k may be applied using the external current source $I_{SNS}$, and the digital output, $N_{TIAO-1}$, may be read out, and the actual value of $R_f$ may be calculated using equations (3) and (4).

$$N_{TIAO-1} = k(N_{R_f} \pm \Delta N_{R_f}) \quad (3)$$

$$(N_{R_f} \pm \Delta N_{R_f}) = \frac{N_{TIAO-1}}{k} \quad (4)$$

Then the calibrated output may be derived in the presence of an excitation output according to equation (5).

$$N_{TIAO_{CAL}} = N_{EXO} + \frac{N_{TIAO} - N_{EXO}}{N_{R_f} \pm \Delta N_{R_f}} N_{R_f} \quad (5)$$

Each output sample of ADC2 118 may be calibrated. In this manner, high accuracy of the calibration of the transimpedance gain element $R_f$ may be achieved. The accuracy is effectively limited only by the precision of the external current source and the ADCs 108/118. In one embodiment, alternating current may be used to remove a dependency on any direct current offset in the system 100. In one embodiment, a transimpedance gain element accuracy of ±1% is achieved.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. A method for maintaining a constant bias current across a voltage swing of an input signal received by input transconductors of an amplifier, comprising:
generating a supply side current mirror gate voltage as a function of input signal voltage; and
using the gate voltage for controlling bias current sources to the input transconductors, wherein a bias current of the input transconductors is maintained as constant at a summing node of the amplifier across the voltage swing of the input signal.

2. The method of claim 1, further comprising:
wherein when the input signal voltage is low, the gate voltage turns off the bias current sources to the input transconductors and tail current sources of the input transconductors; and
wherein when the input signal voltage is not low, the gate voltage turns on the bias current sources to the input transconductors and the tail current sources of the input transconductors.

3. The method of claim 1, further comprising:
wherein an integrated circuit comprises the amplifier, wherein the integrated circuit includes an input pin for connection to a sensor external to the integrated circuit, wherein the integrated circuit includes a switch connected between the pin and gate terminals of input devices of the amplifier, wherein the input devices comprise the input transconductors;
comparing a voltage on the pin with a reference generated internally to the integrated circuit; and
controlling the switch, based on said comparing, to disconnect the input transconductors from the pin in response to detecting a short condition at the pin.

4. The method of claim 1, further comprising:
wherein a transimpedance amplifier (TIA) comprises the amplifier and a transimpedance gain element, wherein the TIA receives a current from a sensor and outputs a voltage proportional to the sensor current based on a value of the transimpedance gain element;
applying an external direct current (DC) current from an external DC current source to a non-inverting input of the TIA;
measuring a voltage across the transimpedance gain element using at least two analog-to-digital converters (ADCs) within the TIA;
determining the value of the transimpedance gain element by using the measured voltage and the external DC current; and
using a digital calibration loop within the TIA to determine a calibrated value for the transimpedance gain element using an output of the digital calibration loop.

5. The method of claim 1, further comprising:
averaging source voltages of at least two of the transconductors to provide an average source voltage;
applying the average source voltage to wells of input devices of the at least two transconductors to reduce back bias effect; and
wherein the input devices are laid out in a same well and have a common centroid to cancel out process mismatches.

6. The method of claim 1, further comprising:
wherein a first one or more of the input transconductors process the input signal when the input signal voltage is high and a second one or more of the input transconductors process the input signal when the input signal voltage is low;
using a first current digital-to-analog converter (I-DAC) to trim an offset of the first one or more transconductors;
using a second I-DAC to trim an offset of the second one or more transconductors; and
wherein said using the first and second I-DACs attains low offsets across a rail-to-rail input common mode range of the amplifier.

7. An apparatus, comprising:
an amplifier comprising:
input transconductors that receive an input signal, the input signal having a voltage swing;
a supply side current mirror that generates a gate voltage as a function of input signal voltage; and
current sources that provide a bias current of the input transconductors as a function of the gate voltage to maintain a constant bias current at a summing node of the amplifier across the voltage swing of the input signal.

8. The apparatus of claim 7, further comprising:
wherein when the input signal voltage is low, the gate voltage turns off the bias current sources to the input transconductors and tail current sources of the input transconductors; and
wherein when the input signal voltage is not low, the gate voltage turns on the bias current sources to the input transconductors and the tail current sources of the input transconductors.

9. The apparatus of claim 7, further comprising:
an input pin for connection to a sensor external to an integrated circuit that comprises the amplifier;
a comparator that compares a voltage on the pin with a reference generated internally to the integrated circuit;
a switch connected between the pin and gate terminals of input devices of the amplifier, wherein the input devices comprise the input transconductors; and
wherein the comparator output voltage controls the switch to disconnect the input transconductors from the pin in response to detecting a short condition at the pin.

10. The apparatus of claim 7, further comprising:
a transimpedance amplifier (TIA) comprising:
the amplifier;
a transimpedance gain element; and
at least two analog-to-digital converters (ADCs);
wherein the TIA receives a current from a sensor and outputs a voltage proportional to the sensor current based on a value of the transimpedance gain element;
wherein the at least two ADCs are usable for measuring a voltage across the transimpedance gain element in response to application of an external direct current (DC) current from an external DC current source to a non-inverting input of the TIA;
wherein a value of the transimpedance gain element is determinable by using the measured voltage and the external DC current; and
wherein a calibrated value for the transimpedance gain element is determinable using an output of a digital calibration loop within the TIA.

11. The apparatus of claim 7, further comprising:
resistors that average source voltages of at least two of the transconductors to provide an average source voltage and that apply the average source voltage to wells of input devices of the at least two transconductors to reduce back bias effect; and wherein the input devices are laid out in a same well and have a common centroid to cancel out process mismatches.

12. The apparatus of claim 7, further comprising:
wherein the input transconductors comprise:
  a first one or more transconductors that process an input voltage when the input voltage is high; and
  a second one or more transconductors that process the input voltage when the input voltage is low;
a first current digital-to-analog converter (I-DAC) used to trim an offset of the first one or more transconductors;
a second I-DAC used to trim an offset of the second one or more transconductors; and
wherein use of the first and second I-DACs attains low offsets across a rail-to-rail input common mode range over which the amplifier operates.

13. A method for increasing linearity of an amplifier having transconductance-cancelling transconductors, comprising:
averaging source voltages of the transconductance-cancelling transconductors to provide an average source voltage;
applying the average source voltage to wells of input devices of the transconductance-cancelling transconductors to reduce back bias effect; and
wherein the input devices are laid out in a same well and have a common centroid to cancel out process mismatches.

14. The method of claim 13, further comprising:
generating a supply side current mirror gate voltage as a function of input signal voltage; and
using the gate voltage for providing a bias current of the transconductors, wherein the bias current is maintained as constant.

15. The method of claim 13, further comprising:
wherein the transconductors comprise:
  a first one or more transconductors that process an input voltage when the input voltage is high; and
  a second one or more transconductors that process the input voltage when the input voltage is low;
using a first current digital-to-analog converter (I-DAC) to trim an offset of the first one or more transconductors that process the high input voltage;
using a second I-DAC to trim an offset of the second one or more transconductors that process the low input voltage; and
wherein said using the first and second I-DACs attains low offsets across the rail-to-rail input common mode range.

16. An amplifier, comprising:
transconductance-cancelling transconductors;
resistors that average source voltages of the transconductance-cancelling transconductors to provide an average source voltage and that apply the average source voltage to wells of input devices of the transconductance-cancelling transconductors to reduce back bias effect; and
wherein the input devices are laid out in a same well and have a common centroid to cancel out process mismatches.

17. The amplifier of claim 16, further comprising:
wherein the transconductors receive an input signal, the input signal having a voltage swing;
a supply side current mirror that generates a gate voltage as a function of the input signal voltage; and
current sources that provide a bias current of the transconductors as a function of the gate voltage to maintain a constant bias current across the voltage swing of the input signal.

18. The amplifier of claim 16, further comprising:
a first one or more transconductors that process an input voltage when the input voltage is high;
a second one or more transconductors that process the input voltage when the input voltage is low;
a first current digital-to-analog converter (I-DAC) used to trim an offset of the first one or more transconductors;
a second I-DAC used to trim an offset of the second one or more transconductors;
wherein use of the first and second I-DACs attains low offsets across a rail-to-rail input common mode range over which the amplifier operates;
resistors that average source voltages of the first one or more transconductors to provide an average source voltage and that apply the average source voltage to wells of input devices of the first one or more transconductors to reduce back bias effect; and
wherein input devices of the first one or more transconductors are laid out in a same well and have a common centroid to cancel out process mismatches.

19. A method of trimming offsets of transconductors of an amplifier to increase its linearity across a rail-to-rail input common mode range, wherein the amplifier receives an input voltage and includes a first one or more transconductors that process the input voltage when the input voltage is high and a second one or more transconductors that process the input voltage when the input voltage is low, comprising:
using a first current digital-to-analog converter (I-DAC) to trim an offset of the first one or more transconductors that process the high input voltage;
using a second I-DAC to trim an offset of the second one or more transconductors that process the low input voltage; and
wherein said using the first and second I-DACs attains low offsets across the rail-to-rail input common mode range.

20. The method of claim 19, further comprising:
generating a supply side current mirror gate voltage as a function of input signal voltage; and
using the gate voltage for providing a bias current of the transconductors, wherein the bias current is maintained as constant.

21. The method of claim 19, further comprising:
averaging source voltages of the first one or more transconductors to provide an average source voltage, wherein the first one or more transconductors comprise transconductance-cancelling transconductors;
applying the average source voltage to wells of input devices of the transconductance-cancelling transconductors to reduce back bias effect; and
wherein the input devices are laid out in a same well and have a common centroid to cancel out process mismatches.

22. An amplifier, comprising:
a first one or more transconductors that process an input voltage when the input voltage is high;
a second one or more transconductors that process the input voltage when the input voltage is low;
a first current digital-to-analog converter (I-DAC) used to trim an offset of the first one or more transconductors;
a second I-DAC used to trim an offset of the second one or more transconductors; and wherein use of the first and second I-DACs attains low offsets across a rail-to-rail input common mode range over which the amplifier operates.

23. The amplifier of claim 22, further comprising:
wherein the transconductors receive an input signal, the input signal having a voltage swing;
a supply side current mirror that generates a gate voltage as a function of the input signal voltage; and
current sources that provide a bias current of the transconductors as a function of the gate voltage to maintain a constant bias current across the voltage swing of the input signal.

24. The amplifier of claim 22, further comprising:
wherein the first one or more transconductors comprise transconductance-cancelling transconductors;
resistors that average source voltages of the first one or more transconductors to provide an average source voltage and that apply the average source voltage to wells of input devices of the transconductance-cancelling transconductors to reduce back bias effect; and
wherein the input devices are laid out in a same well and have a common centroid to cancel out process mismatches.

\* \* \* \* \*